(12) United States Patent
Kobayashi et al.

(10) Patent No.: US 10,032,866 B2
(45) Date of Patent: Jul. 24, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yusuke Kobayashi, Tsukuba (JP); Manabu Takei, Tsukuba (JP); Shinsuke Harada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/800,200

(22) Filed: Nov. 1, 2017

(65) Prior Publication Data
US 2018/0182847 A1    Jun. 28, 2018

(30) Foreign Application Priority Data

Dec. 28, 2016    (JP) .................... 2016-256897

(51) Int. Cl.
*H01L 29/66*     (2006.01)
*H01L 29/06*     (2006.01)
*H01L 29/16*     (2006.01)
*H01L 29/40*     (2006.01)
(Continued)

(52) U.S. Cl.
CPC ........ *H01L 29/0661* (2013.01); *H01L 21/046* (2013.01); *H01L 21/0475* (2013.01); *H01L 29/1608* (2013.01); *H01L 29/402* (2013.01); *H01L 29/66068* (2013.01); *H01L 29/66712* (2013.01); *H01L 29/66734* (2013.01); *H01L 29/7811* (2013.01); *H01L 29/7813* (2013.01)

(58) Field of Classification Search
None
See application file for complete search history.

(56) References Cited

U.S. PATENT DOCUMENTS

| 2008/0001217 A1* | 1/2008 | Kawashima | ........ H01L 29/0623 257/330 |
| 2010/0244146 A1* | 9/2010 | Uno | .................. H01L 29/42372 257/401 |
| 2014/0008718 A1* | 1/2014 | Toyoda | ............. H01L 21/82341 257/330 |

FOREIGN PATENT DOCUMENTS

JP    H07-161983 A    6/1995

OTHER PUBLICATIONS

Y. Nakano et al., "690V, 1.00 mΩcm² 4H-SiC Double-Trench MOSFETs", Materials Science Forum, (Switzerland), Trans Tech Publications Inc., vols. 717-720, pp. 1069-1072, May 2012.

\* cited by examiner

*Primary Examiner* — Minh-Loan Tran
(74) *Attorney, Agent, or Firm* — Rabin & Berdo, P.C.

(57) ABSTRACT

In an active region, a contact trench in which a source electrode is embedded is provided. In a boundary region between the active region and the edge termination region, a tapered trench is provided. A second p-type base region is provided along an inner wall of the contact trench and extends to the boundary region to be provided along a base front surface and an inner wall of the tapered trench. An angle $\theta 3$ of the side walls of the tapered trench with respect to a substrate front surface is smaller than an angle $\theta 1$ of the side walls of the contact trench with respect to the substrate front surface. At a second mesa portion between the tapered trench and a step of the edge termination region, a gate runner is arranged on the base front surface, via a field oxide film.

7 Claims, 14 Drawing Sheets

(51) Int. Cl.
*H01L 29/78* (2006.01)
*H01L 21/04* (2006.01)

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-256897, filed on Dec. 28, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Trench-gate type metal oxide semiconductor field effect transistors (MOSFETs) sustaining voltages of 400V, 600V, 1200V, 1700V, 3300V, 6500V or higher are commonly known power semiconductor devices. For example, trench-gate type MOSFETs that use silicon carbide (SiC) (hereinafter, SiC-MOSFETs) are employed in power converting equipment such as converters and inverters. There is demand for these power semiconductor devices to have low loss and high efficiency while at the same time satisfy required breakdown voltages. Further, accompanying increases in element area, a gate runner has to be arranged between the active region and the edge termination region in medium-capacity and large-capacity power semiconductor devices so that variation in the potential distribution of the gate electrode on the chip surface does not occur.

One proposed conventional trench-gate type SiC-MOSFET includes a contact trench between adjacent gate trenches (for example, refer to Japanese Laid-Open Patent Publication No. H07-161983 and Y. Nakano, et al, "690V, 1.00 mΩcm2 4H—SiC Double-Trench MOSFETs", Materials Science Forum, (Switzerland), Trans Tech Publications Inc., May 2012, Vols. 717-720, p. 1069-1072). A gate trench is a trench in which a gate electrode is embedded via a gate insulating film. A contact trench is a trench that is provided between adjacent gate trenches (mesa portion) and in which a metal electrode (source electrode) is embedded. At the metal electrode and a semiconductor region exposed at an inner wall of the contact trench, a contact (electrical contact portion) is formed. A structure of a boundary region between the active region and the edge termination region of a conventional trench-gate type SiC-MOSFET will be described. FIG. 14 is a cross-sectional view of the boundary region between the active region and the edge termination region of a conventional trench-gate type SiC-MOSFET.

The conventional trench-gate type SiC-MOSFET depicted in FIG. 14 includes on a semiconductor base (hereinafter, silicon carbide base) 110 containing silicon carbide, a boundary region 143 between an active region 141 and an edge termination region 142. The silicon carbide base 110 is formed by sequentially forming plural silicon carbide layers including an n⁻-type drift region 102 (102a, 102b) and a p-type base region 103 formed by epitaxial growth in the order mentioned on an n⁺-type supporting substrate containing silicon carbide (hereinafter, n⁺-type silicon carbide substrate (not depicted)) 101. The active region 141 is a region that bears current flow in a direction of substrate thickness. In the active region 141, a contact trench 108 and trench-gate type metal oxide semiconductor insulated gate (MOS gate) structure are arranged. The edge termination region 142 is arranged so as to surround a periphery of the active region 141, with the boundary region 143 in between. Reference numeral 140 represents a step formed by making a front surface of the silicon carbide base 110 of the entire edge termination region 142 lower than that of the active region 141 (recessed toward the drain).

The p-type base region 103 constituting the MOS gate structure is provided along an inner wall of the contact trench 108 (a bottom 108a and side walls 108b). A portion (113) of the p-type base region 103 along the bottom 108a of the contact trench 108 reaches farther on a drain side than a gate trench (not depicted) does. Hereinafter, in the p-type base region 103, a shallow portion thereof is assumed as the (first) p-type base region 103 and the portion (113) thereof along the inner wall of the contact trench 108 is assumed as a second p-type base region 113. The second p-type base region 113, in the periphery of the active region 141, extends from the side walls 108b of the contact trench 108 to the boundary region 143 and is contact with a junction termination extension (JTE) structure 130 of the edge termination region 142. The JTE structure 130 and the second p-type base region 113 of the boundary region 143 are covered by a field oxide film 114. The boundary region 143 is provided to arrange a gate runner 120. In the boundary region 143, the gate runner 120 is arranged constituted by a poly-silicon (poly-Si) layer 121 and a metal layer 122 stacked on the field oxide film 114 in the order mentioned.

SUMMARY OF THE INVENTION

According to one aspect of the present invention, a semiconductor device includes a termination region surrounding an active region; a boundary region provided between the active region and the termination region; and the active region, which includes a first groove provided on a first main surface of a semiconductor substrate of a first conductivity type, a first electrode embedded in the first groove, and a second electrode. Current flows between the first electrode and the second electrode in an ON state. The boundary region includes a second groove provided in the first main surface of the semiconductor substrate and having a side wall with a slope that is smaller than that of the first groove with respect to the first main surface of the semiconductor substrate, and a first semiconductor region of a second conductivity type provided along an inner wall of the second groove.

In the semiconductor device, a distance between the first groove and the second groove is 8 µm or less.

In the semiconductor device, the active region has a second semiconductor region of the second conductivity type in contact with the first electrode at an inner wall of the first groove, and at a portion of the second semiconductor region along the inner wall of the first groove, an impurity concentration is equal to an impurity concentration of the first semiconductor region.

In the semiconductor device, the second semiconductor region extends along the first main surface of the semiconductor substrate to the boundary region and is connected to the first semiconductor region.

In the semiconductor device, the active region further includes a third semiconductor region of the first conductivity type selectively provided in the second semiconductor region; a gate insulating film provided in contact with a region of the second semiconductor region between the semiconductor substrate and the third semiconductor region; and a gate electrode provided on an opposite side of the second semiconductor region via the gate insulating film. A gate runner electrically connected to the gate electrode is provided between the second groove and the termination region.

In the semiconductor device, the semiconductor substrate is a silicon carbide substrate.

According to another aspect of the present invention, a method of manufacturing a semiconductor device, includes forming a first groove in a first main surface of a semiconductor substrate of a first conductivity type, the first groove being formed in an active region; forming a second groove in the first main surface of the semiconductor substrate in a boundary region between the active region and a termination region surrounding the active region, the second groove having a side wall with a slope smaller than that of the first groove with respect to the first main surface; forming a first diffusion region of a second conductivity type along a side wall of the first groove; forming a second diffusion region of the second conductivity type along a bottom of the first groove and an inner wall of the second groove; forming a first electrode so as to be embedded in the first groove; and forming a second electrode, current flowing between the first electrode and the second electrode in an ON state.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
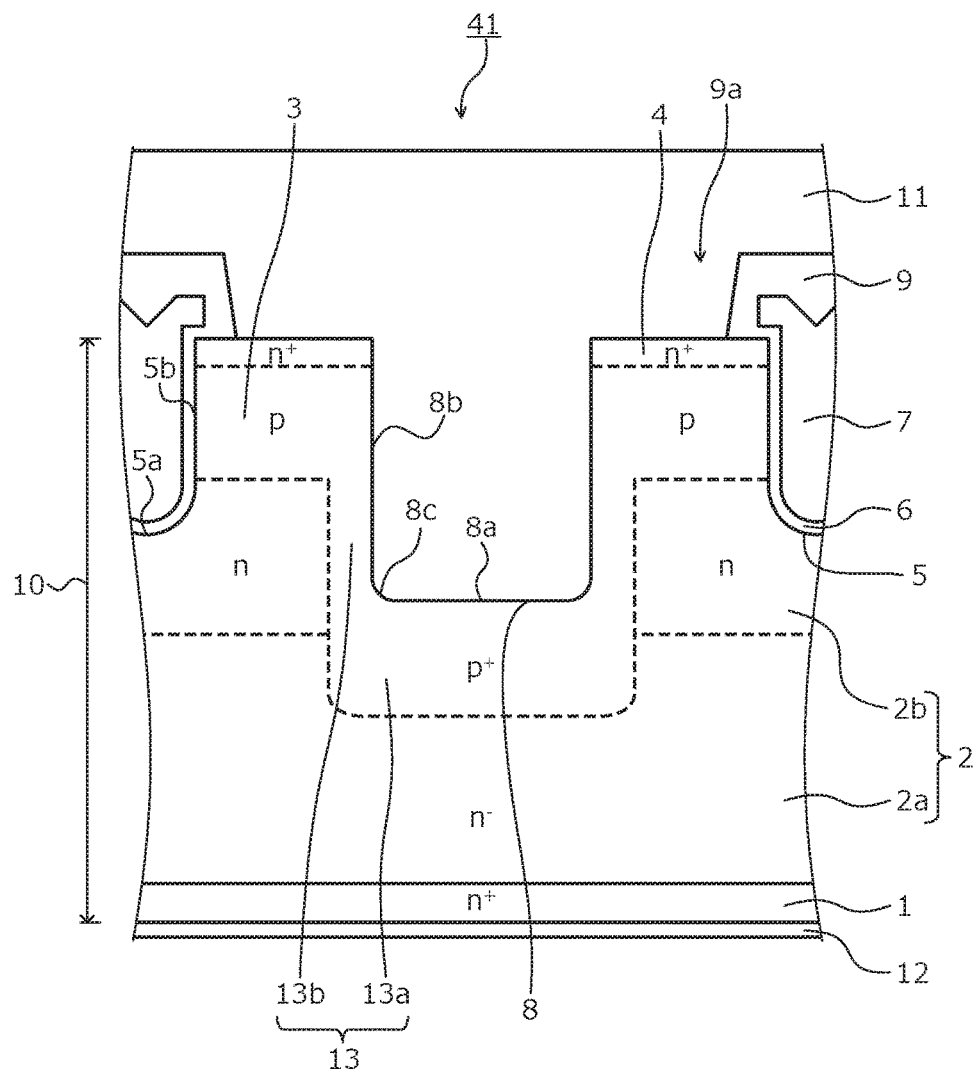
FIG. 1 is a cross-sectional view of a structure of an active region of a semiconductor device according to an embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of the semiconductor device according to an embodiment will be described taking, as an example, a trench-gate type MOSFET (SiC-MOSFET) that uses silicon carbide (SiC). FIG. 1 is a cross-sectional view of a structure of the active region of the semiconductor device according to the embodiment. In FIG. 1, the structure between adjacent unit cells (functional unit of an element) is depicted and other unit cells repeatedly arranged to be adjacent to these unit cells are not depicted. As depicted in FIG. 1, in the semiconductor device according to the embodiment, in an active region 41, a trench-gate type MOS gate structure and a contact trench (first groove) 8 are provided on a front surface (surface on an $n^-$-type drift region 2 side) side of a semiconductor base containing silicon carbide (n-type silicon carbide base (semiconductor substrate)) 10. The active region 41 is a region that bears current flowing in a thickness direction of the semiconductor substrate and through which current flows when the SiC-MOSFET is in an ON state.

In particular, the silicon carbide base (semiconductor chip) 10 is formed by sequentially forming plural silicon carbide layers including an $n^-$-type drift region 2 (2a, 2b) and a p-type base region 3 formed by epitaxial growth in the order mentioned on an $n^+$-type supporting substrate (hereinafter, $n^+$-type silicon carbide substrate) 1 containing silicon carbide. On a front surface (surface on a p-type base region 3 side) side of the silicon carbide base 10, a MOS gate structure is provided constituted by $n^+$-type source regions (third semiconductor regions) 4, gate trenches 5, gate insulating films 6, and gate electrodes 7. An impurity concentration of the $n^-$-type drift region 2 may be higher at a portion (hereinafter, n-type high-concentration drift region) 2b of the $n^-$-type drift region 2 on a base front surface side thereof as compared to a portion (hereinafter, $n^-$-type low-concentration drift region) 2a of the $n^-$-type drift region 2 on a base rear surface side.

The gate trenches 5 are provided from a base front surface to a depth not reaching the $n^-$-type low-concentration drift region 2a, for example. In the gate trenches 5, the gate electrodes 7 are embedded via the gate insulating films 6. Between adjacent gate trenches 5 (mesa portion), the contact trench 8 is provided. The contact trench 8 is a trench provided between the adjacent gate trenches 5 (mesa portion) and in which a metal electrode (source electrode described later (first electrode) 11) is embedded. At the metal electrode and a semiconductor region exposed at an inner wall (a bottom 8a and side walls 8b) of the contact trench 8, a contact (electrical contact portion) is formed. A depth of the contact trench 8 is deeper than a depth of the gate trench 5.

The p-type base region 3 is provided between the adjacent gate trenches 5, at a depth deeper than that of the gate trench 5. A portion (second semiconductor region) 13 of the p-type base region 3 is provided along the inner wall of the contact trench 8 so as to be exposed at the inner wall of the contact trench 8, and along the bottom 8a of the contact trench 8, the portion 13 of the p-type base region 3 is deeper than a depth of the gate trench 5 and reaches the drain side. The portion 13 of the p-type base region 3, for example, along the bottom 8a of the contact trench 8, may reach farther on the drain side than an interface of the $n^-$-type low-concentration drift region 2a and the n-type high-concentration drift region 2b does.

In this manner, the portion 13 of the p-type base region 3 reaches farther on the drain side than a bottom 5a of the gate trench 5 does whereby electric field is applied to the portion of the p-type base region 3 along the bottom 8a of the contact trench 8 when the SiC-MOSFET is OFF. Therefore, a concentration of electric field at the gate insulating film 6 at the bottom 5a of the gate trench 5 is mitigated. Reference numeral 5b represents a side wall of the gate trench 5. Hereinafter, in the p-type base region 3, a portion between the adjacent gate trenches 5 and shallower than the gate trenches 5 is indicated as the first p-type base region 3 and the portion 13 along the inner wall of the contact trench 8 is indicated as the second p-type base region 13. An impurity concentration of a portion 13a of the second p-type base region 13 along the bottom 8a of the contact trench 8 may be higher than an impurity concentration of portions 13b of the second p-type base region 13 along the side walls 8b of the contact trench 8.

The $n^+$-type source regions 4 are selectively provided in a surface region of the first p-type base region 3. In the surface region of the first p-type base region 3, $p^+$-type contact regions (not depicted) may be selectively provided. A contact hole 9a penetrating an interlayer insulating film 9 in a depth direction is formed so be connected to the contact trench 8. The source electrode 11 is provided so as to be embedded in the contact hole 9a and the contact trench 8, and is in contact with the first and second p-type base regions 3, 13, the $n^+$-type source regions 4, and the $p^+$-type contact region. On a rear surface (surface on the $n^+$-type silicon carbide substrate 1 side, the $n^+$-type silicon carbide substrate 1 being an $n^+$-type drain layer) of the silicon carbide base 10, a drain electrode (second electrode) 12 is provided as a rear electrode.

Figure 2:
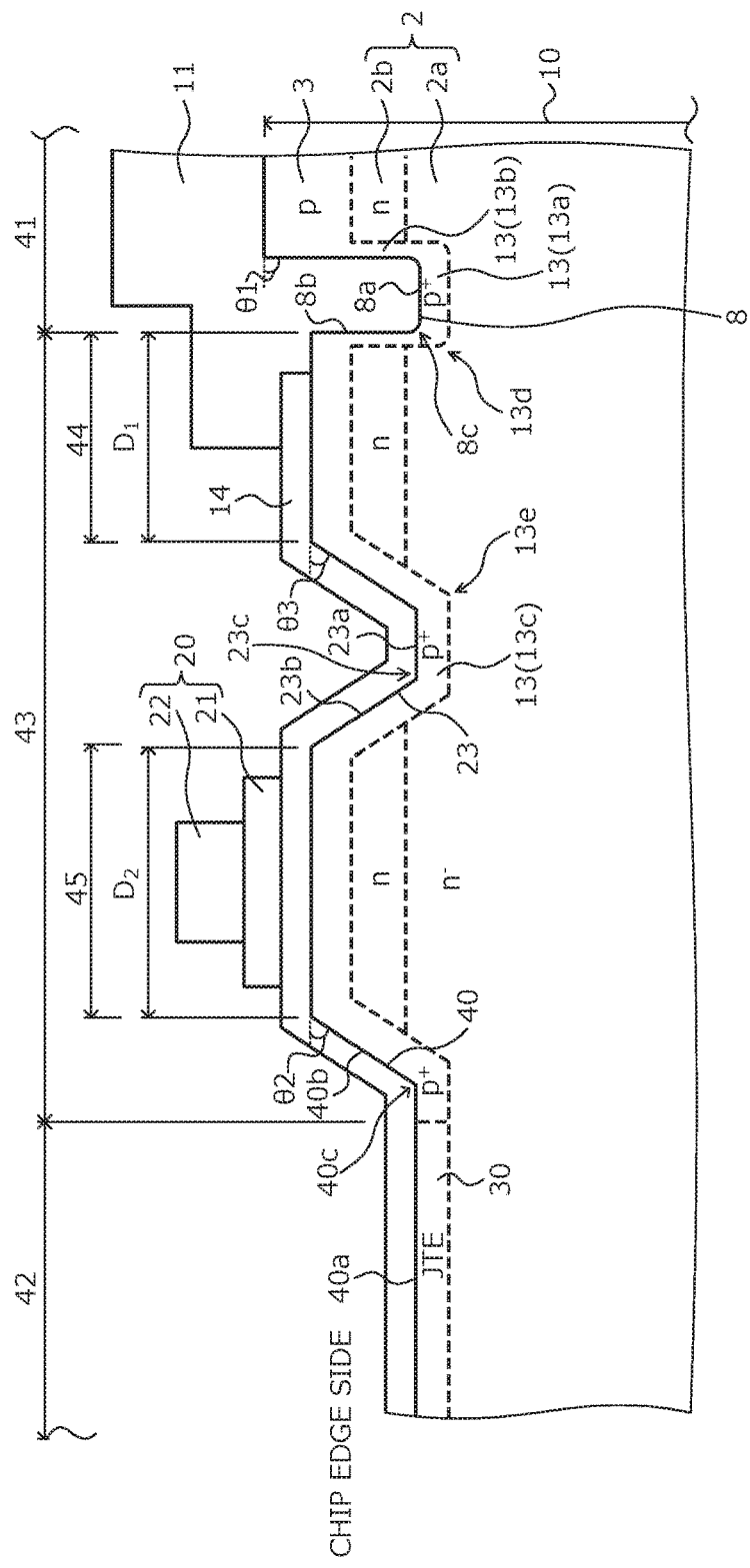
FIG. 2 is a cross-sectional view of a structure of a boundary region between an active region and an edge termination region of the semiconductor device according to the embodiment.

A structure farther on an outer side (chip edge side) than the active region 41 will be described. FIG. 2 is a cross-sectional view of a structure of a boundary region between an active region and an edge termination region of the semiconductor device according to the embodiment. An edge termination region 42 is provided farther on the outer side than the active region 41 so as to surround a periphery of the active region 41. The edge termination region 42 is a region that mitigates electric field of the front surface of the silicon carbide base 10 and maintains breakdown voltage. On the front surface of the silicon carbide base 10 across the entire edge termination region 42, the edge termination region 42 is made lower than the active region 41 (recessed toward the drain side), forming a step 40 and the $n^-$-type drift region 2 (e.g., the $n^-$-type low-concentration drift region 2a) is exposed.

A bottom 40a of the step 40 is the front surface (the base front surface) of the silicon carbide base 10, newly formed in the edge termination region 42 by the formation of the step 40. A side wall 40b of the step 40 is the front surface of the silicon carbide base 10 positioned between the bottom 40a of the step 40 and the base front surface (a surface of a second mesa portion 45 described later) that is farther on an inner side (the active region 41 side) than the step 40, and side wall 40b of the step 40 has a slope forming an acute angle θ2 with the surface of the second mesa portion 45. The angle θ2 of the side wall 40b of the step 40 may be about 90 degrees (0 degrees <θ2≤90 degrees) with respect to the surface of the second mesa portion 45. The side wall 40b of the step 40, for example, is positioned in a boundary region 43 between the active region 41 and the edge termination region 42.

In the $n^-$-type drift region 2 exposed at the bottom 40a of the step 40, for example, a JTE structure 30 is arranged. The JTE structure 30 is an edge termination structure in which plural p-type semiconductor regions (hereinafter, $p^-$-type low-concentration regions (not depicted)) are arranged adjacently in a concentric shape surrounding a periphery of the active region 41 and respective impurity concentrations of the $p^-$-type low-concentration regions are progressively lower the farther on the outer side the $p^-$-type low-concentration region is arranged. The impurity concentrations of the $p^-$-type low-concentration regions constituting the JTE structure 30 are lower than an impurity concentration of the second p-type base region 13 of the boundary region 43. The JTE structure 30 is covered by a field oxide film 14. The field oxide film 14 extends to an inner side of the boundary region 43 and in the boundary region 43, the field oxide film 14 covers the base front surface and an inner wall (a bottom 23a and side walls 23b) of a tapered trench (second groove) 23 described later. In the edge termination region 42 and the boundary region 43, exposure at the base front surface is an arrangement enabling contact with the field oxide film 14.

In the boundary region 43, the second p-type base region 13 extends from the outermost side wall 8b of the contact trench 8 to a depth shallower than that of the tapered trench 23. The second p-type base region (first semiconductor region) 13 (13c) of the boundary region 43 is provided along the base front surface and the inner wall of the tapered trench 23, and is exposed at the base front surface and the inner wall of the tapered trench 23. In the boundary region 43, a portion of the second p-type base region 13 along the bottom 23a of the tapered trench 23 may reach farther on the drain side than the interface of the $n^-$-type low-concentration drift region 2a and the n-type high-concentration drift region 2b does. Further, in the boundary region 43, the second p-type base region 13 extends along the side wall 40b of the step 40 so as to cover a bottom corner portion (boundary of the bottom 40a of the step 40 and the side wall 40b) 40c of the step 40, and the second p-type base region 13 is in contact with the innermost $p^-$-type low-concentration region (not depicted) of the JTE structure 30. An impurity concentration of the second p-type base region 13 (13c) in the boundary region 43 may be about the same as the impurity concentration of the portion 13a of the second p-type base region 13 in the active region 41, along the bottom 8a of the contact trench 8.

In the boundary region 43, on a substrate front surface, a gate runner 20 is provided via the field oxide film 14. The gate runner 20, for example, is formed by a poly-silicon (poly-Si) layer 21 and a metal layer 22 stacked in the order mentioned. The gate runner 20, for example, is arranged to have a ring-shaped planar layout surrounding a periphery of the active region 41. Further, in the boundary region 43, in the substrate front surface, a trench having a tapered cross-sectional shape (hereinafter, tapered trench) 23 is provided farther on the device inner side than the gate runner 20 is. The tapered trench 23 is arranged away from the active region 41, in a ring-shaped planar layout surrounding a periphery of the active region 41. A depth of the tapered trench 23, for example, may the same as the depth of the contact trench 8.

The side walls 23b of the tapered trench 23 have a slope forming an angle θ3 with the substrate front surface (surfaces of first and second mesa portions 44, 45 described later) (0 degrees <θ3<90 degrees). In addition, the angle θ3 of the side walls 23b of the tapered trench 23 with respect to the substrate front surface is smaller than an angle θ1 of the side walls 8b of the contact trench 8 with respect to the substrate front surface (θ3<θ1≤90 degrees). In this manner, by providing the tapered trench 23 having a tapered cross-sectional shape in the boundary region 43, a concentration of electric field at a portion 13d of the second p-type base region 13 having a large curvature along a bottom corner portion (boundary of the bottom 8a of the contact trench 8 and the side walls 8b) 8c of the contact trench 8 is mitigated in a periphery of the active region 41.

Further, by making the angle θ3 of the side walls 23b of the tapered trench 23 with respect to the substrate front surface acute, curvature of a bottom corner portion (boundary of the bottom 23a of the tapered trench 23 and the side walls 23b) 23c of the tapered trench 23 decreases. Thus, curvature of a portion 13e of the second p-type base region 13 extending along the inner wall of the tapered trench 23 decreases along the bottom corner portion 23c of the tapered trench 23, suppressing a concentration of electric field at the portion 13e. Therefore, the gate runner 20 described above is arranged between the tapered trench 23 and the edge termination region 42 (the second mesa portion 45 described later).

In the boundary region 43, two mesa portions (hereinafter, sequentially from the inner side, the first and second mesa portions 44, 45) are formed by the contact trench 8, the tapered trench 23, and the step 40. In other words, between the active region 41 and the edge termination region 42, the first and second mesa portions 44, 45 are arranged in a concentric shape surrounding a periphery of the active region 41. In the second mesa portion 45 (between the tapered trench 23 and the step 40) on the outer side, the gate runner 20 described above is arranged. A width $D_2$ of the second mesa portion 45 is at least wide enough to accommodate the gate runner 20. A width (distance between the contact trench 8 and the tapered trench 23) $D_1$ of the first mesa portion 44 adjacent to the active region 41, for example, may be preferably about 8 μm or less. The reason for this is as follows.

Figure 3:
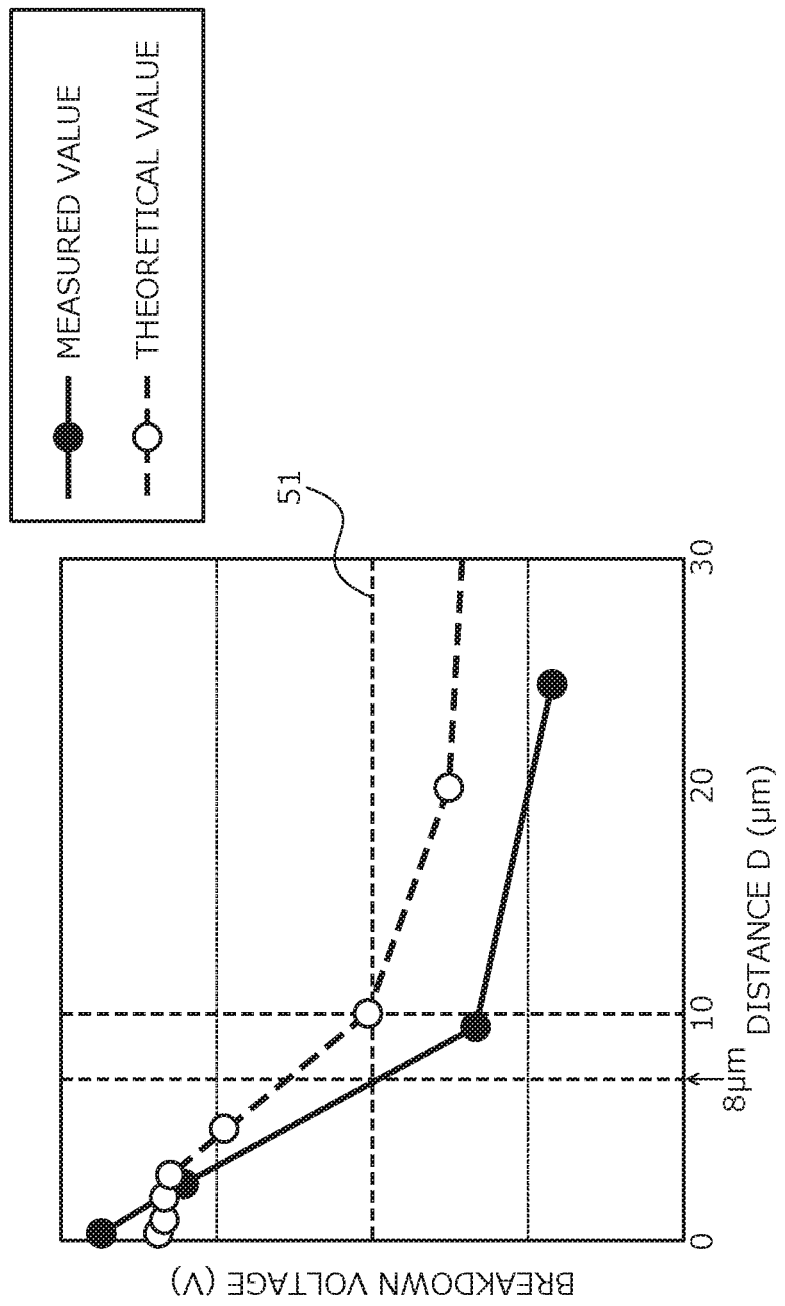
FIG. 3 is a characteristics diagram of breakdown voltage characteristics of the semiconductor device according to the embodiment.
Figure 14:
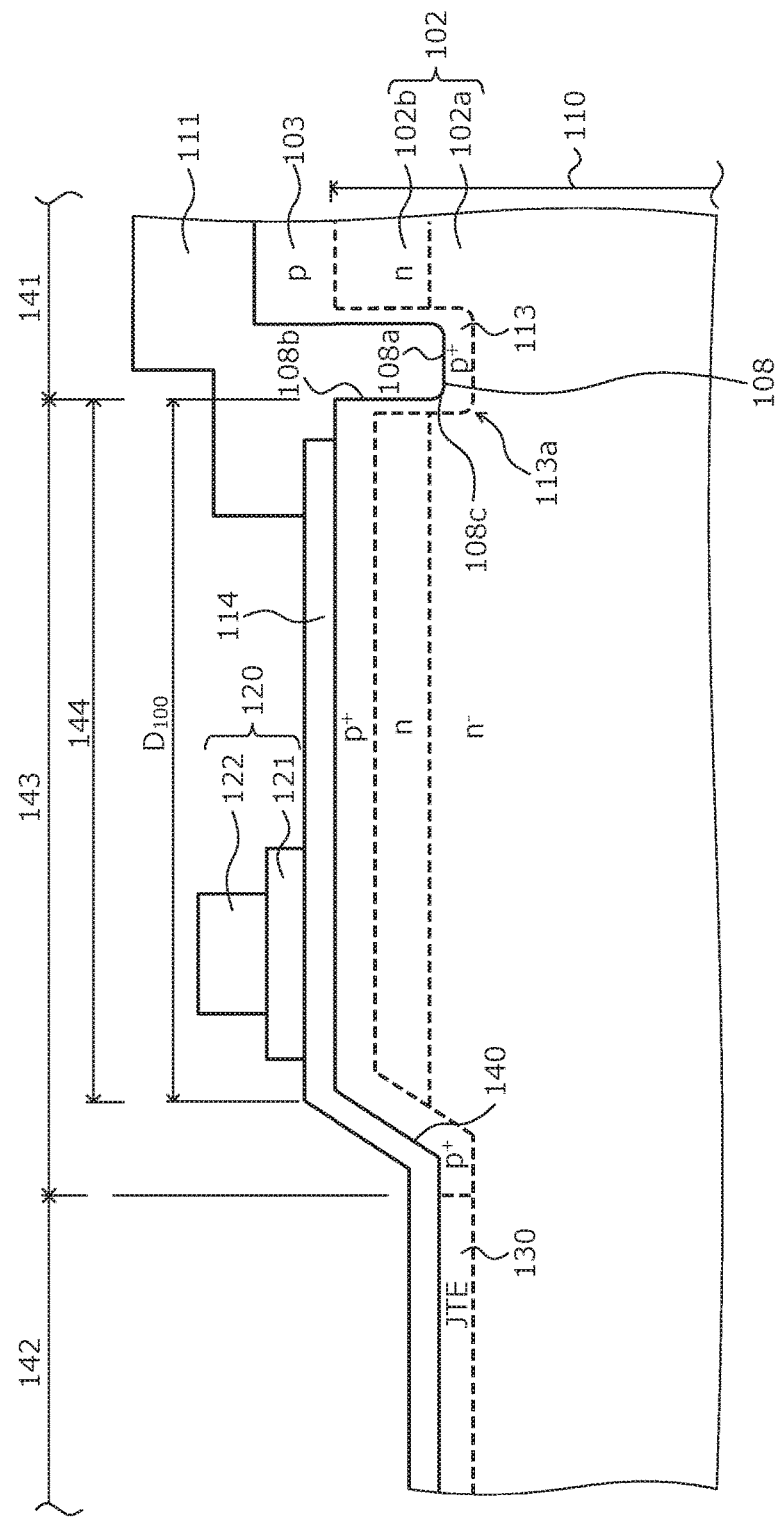
FIG. 14 is a cross-sectional view of a boundary region between an active region and an edge termination region of a conventional trench-gate type SiC-MOSFET.

FIG. 3 is a characteristics diagram of breakdown voltage characteristics of the semiconductor device according to the embodiment. FIG. 3 depicts measured values of the breakdown voltage when the width $D_1$ (distance D in FIG. 3) of the first mesa portion 44 was varied in the semiconductor device according to the embodiment (refer to FIGS. 1 and 2). The breakdown voltage is the breakdown voltage of a portion (the boundary region 43 and the edge termination region 42) farther on the outer side than the active region 41. Further, FIG. 3 depicts theoretical values of the breakdown voltage of a trench-gate type SiC-MOSFET. Simulation results of the breakdown voltage in a conventional structure (refer to FIG. 14) in which the gate runner 120 described above is arranged, where a width $D_{100}$ (distance D) of a mesa portion (between the contact trench 108 and the step 140) 144 adjacent to the active region 141 was varied are assumed as theoretical values.

From the measured values depicted in FIG. 3, in the present invention, it was confirmed that when the width $D_1$ of the first mesa portion 44 is about 8 μm or less, a target breakdown voltage (horizontal dashed line coarser than graduation lines) 51 or higher could be secured. Further, from the results depicted in FIG. 3, it was confirmed that for both the measured values and theoretical values, the breakdown voltage decreased as the widths $D_1$, $D_{100}$ (distance D) of the mesa portions increased. Although not depicted, in the conventional structure in which the gate runner 120 is arranged (refer to FIG. 14), it was confirmed that the width $D_{100}$ of the mesa portion (between the contact trench 108 and the step 140) 144 adjacent to the active region 141 became 10 μm or higher. Therefore, from the theoretical values in FIG. 3, it is found that in the conventional structure depicted in FIG. 14 and in which the gate runner 120 is arranged, the target breakdown voltage 51 is difficult to achieve.

A method of manufacturing a semiconductor device according to the embodiment will be described taking, as an example, a case in which a 3300V trench-gate type SiC-MOSFET is produced (manufactured). FIGS. 4, 5, 6, 7, 8, 9 and 10 are cross-sectional views of the semiconductor device according to the embodiment during manufacture. First, for example, the n$^+$-type silicon carbide substrate 1 (refer to FIG. 1) having an impurity concentration of about $1\times10^{18}$/cm$^3$ to $1\times10^{20}$/cm$^3$ is prepared. Next, by epitaxial growth, on the front surface of the n$^+$-type silicon carbide substrate 1, an n$^-$-type silicon carbide layer that becomes the n$^-$-type low-concentration drift region 2a having an impurity concentration of about, for example, $2\times10^{15}$/cm$^3$ to $4\times10^{15}$/cm$^3$, is deposited (formed) to have, for example, a thickness of about 30 μm.

Figure 4:
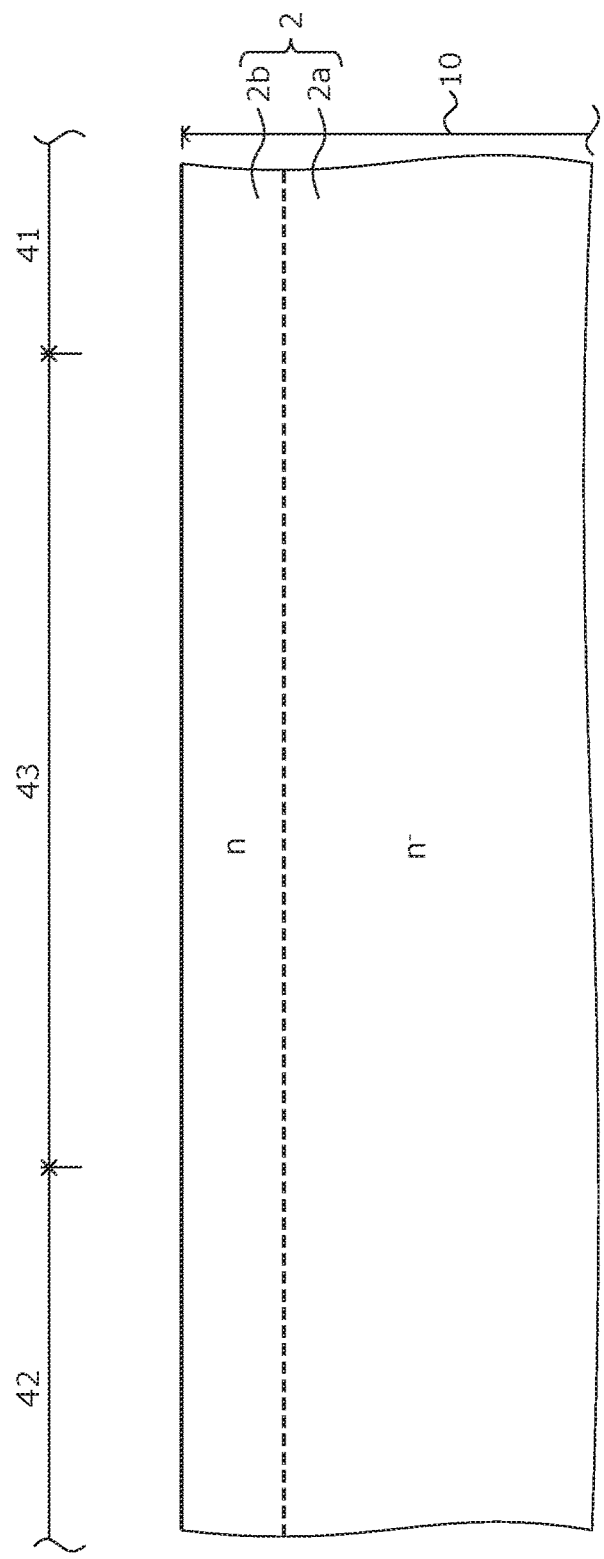
FIGS. 4, 5, 6, 7, 8, 9 and 10 are cross-sectional views of the semiconductor device according to the embodiment during manufacture.

Next, by epitaxial growth, on the n$^-$-type low-concentration drift region 2a, an n-type silicon carbide layer that becomes the n-type high-concentration drift region 2b having an impurity concentration of about, for example, $1\times10^{16}$/cm$^3$ to $1\times10^{18}$/cm$^3$, is deposited to have a thickness of about, for example, 0.5 μm to 3.0 μm. By the processes up to here, the silicon carbide base (semiconductor wafer) 10 in which the n$^-$-type drift regions 2 (2a, 2b) are sequentially stacked on the n$^+$-type silicon carbide substrate 1 is formed (FIG. 4).

Next, on the front surface of the silicon carbide base 10, an oxide film (not depicted) is deposited to have a thickness of about, for example, 1.5 μm to 2.5 μm. The oxide film is patterned by photolithography and etching, exposing portions corresponding to a formation region of the step 40 in the edge termination region 42 and a formation region of the tapered trench 23 in the boundary region 43. Next, after a resist mask (not depicted) used in patterning the oxide film is removed, isotropic etching using the remaining portion of the oxide film as a mask is performed and, the tapered trench 23 and the step 40 are formed at a depth of about, for example, 0.5 μm to 2.5 μm. As a result, the second mesa portion 45 between the tapered trench 23 and the step 40 is formed. Here, a case in which the n-type high-concentration drift region 2b is removed from the entire edge termination region 42, exposing the n$^-$-type low-concentration drift region 2a will be described as an example.

Figure 5:
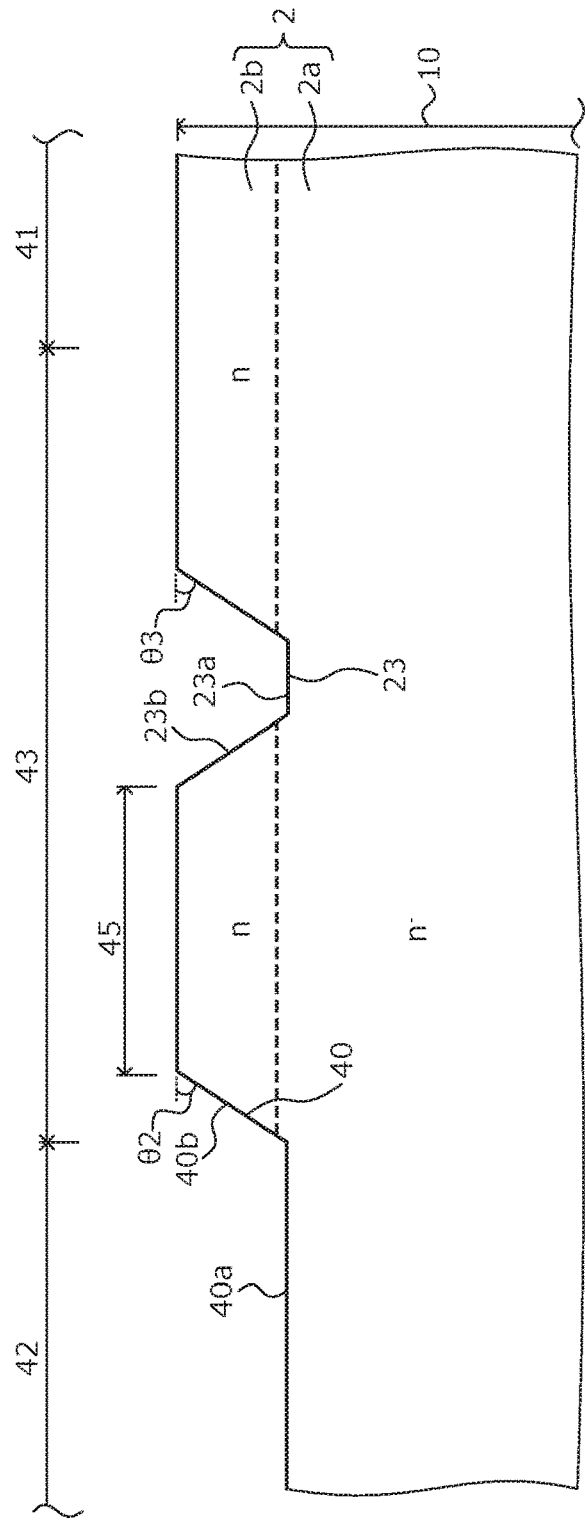

By forming the step 40 and the tapered trench 23 in the same etching process, the semiconductor device according to the embodiment depicted in FIGS. 1 and 2 may be produced without an increase in the number of processes. At the bottom 40a of the step 40 and the bottom 23a of the tapered trench 23, the n$^-$-type low-concentration drift region 2a is exposed. The angle θ3 of the side walls 23b of the tapered trench 23 with respect to the substrate front surface may be, for example, about 20 degrees to 70 degrees (20 degrees ≤θ3≤70 degrees). The angle θ2 of the side wall 40b of the step 40 with respect to the surface of the second mesa portion 45 is also, for example, about 20 degrees to 70 degrees (20 degrees ≤θ2≤70 degrees). Subsequently, the remaining oxide film used to form the step 40 and the tapered trench 23 is removed. The state up to here is depicted in FIG. 5.

Next, on the front surface of the silicon carbide base 10, an oxide film (not depicted) is deposited to have a thickness of about, for example, 1.5 μm to 2.5 μm. Next, the oxide film is patterned by photolithography and etching, exposing a portion that corresponds to a formation region of the p$^-$-type low-concentration regions of the JTE structure 30. Next, after a resist mask (not depicted) used in patterning the oxide film is removed, the remaining portion of the oxide film is used as a mask and a p-type impurity is ion implanted. The remaining portion of the oxide film is removed. A process including the depositing and patterning of the oxide films, the removal of the resist masks, the ion implantation of the p-type impurity, and removal of the remaining portion of the oxide film as one set is repeatedly performed under different ion implantation conditions. This ion implantation, for example, may be varied within the following condition range.

Figure 6:
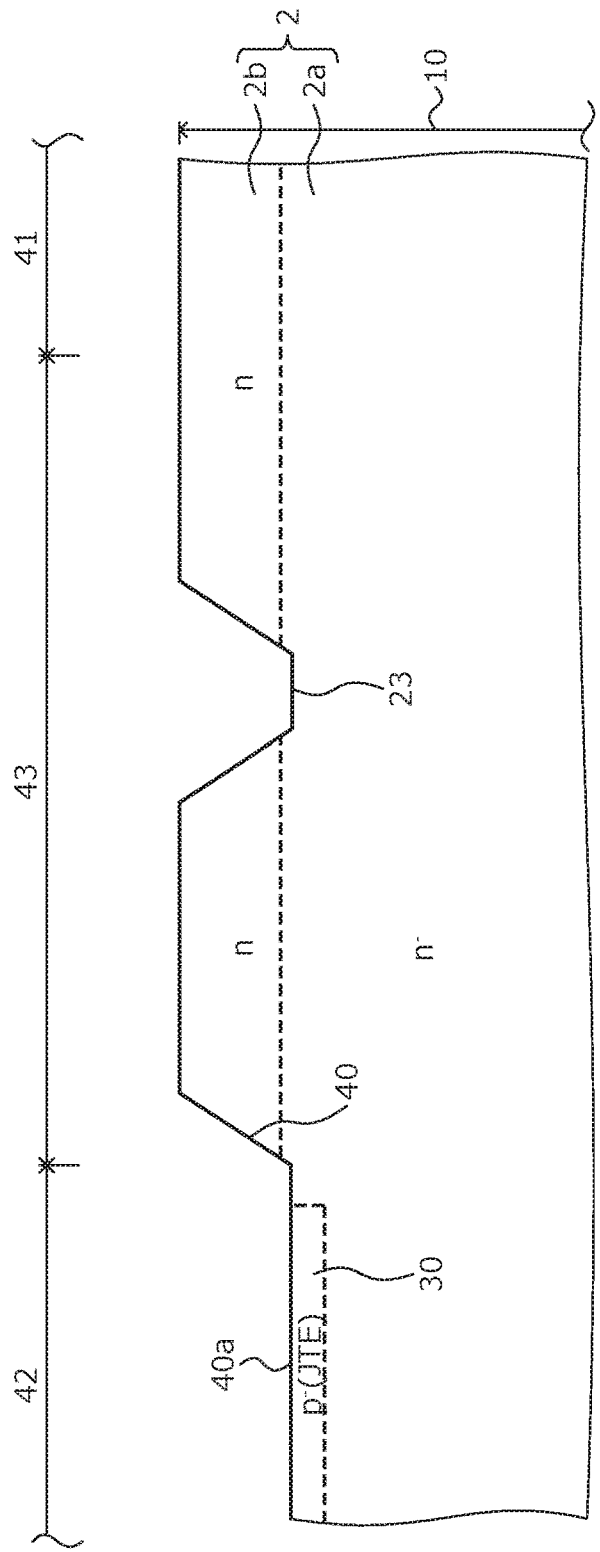

In the ion implantation for forming the p⁻-type low-concentration regions of the JTE structure 30, the dopant, for example, may be aluminum (Al). The temperature at the time of ion implantation may in a range of about 200 degrees C. to 600 degrees C. The dose amount may be a range of, for example, about $1.0 \times 10^{12}/cm^2$ to $1.0 \times 10^{14}/cm^2$. The acceleration energy may be a range of, for example, about 15 keV to 460 keV. The implantation angle may be a range of about, for example, 0 degrees to 10 degrees with respect to the bottom 40a of the step 40. Thus, in the n⁻-type low-concentration drift region 2a exposed at the bottom 40a of the step 40, the plural p⁻-type low-concentration regions constituting the JTE structure 30 are selectively formed. The state up to here is depicted in FIG. 6.

Figure 7:
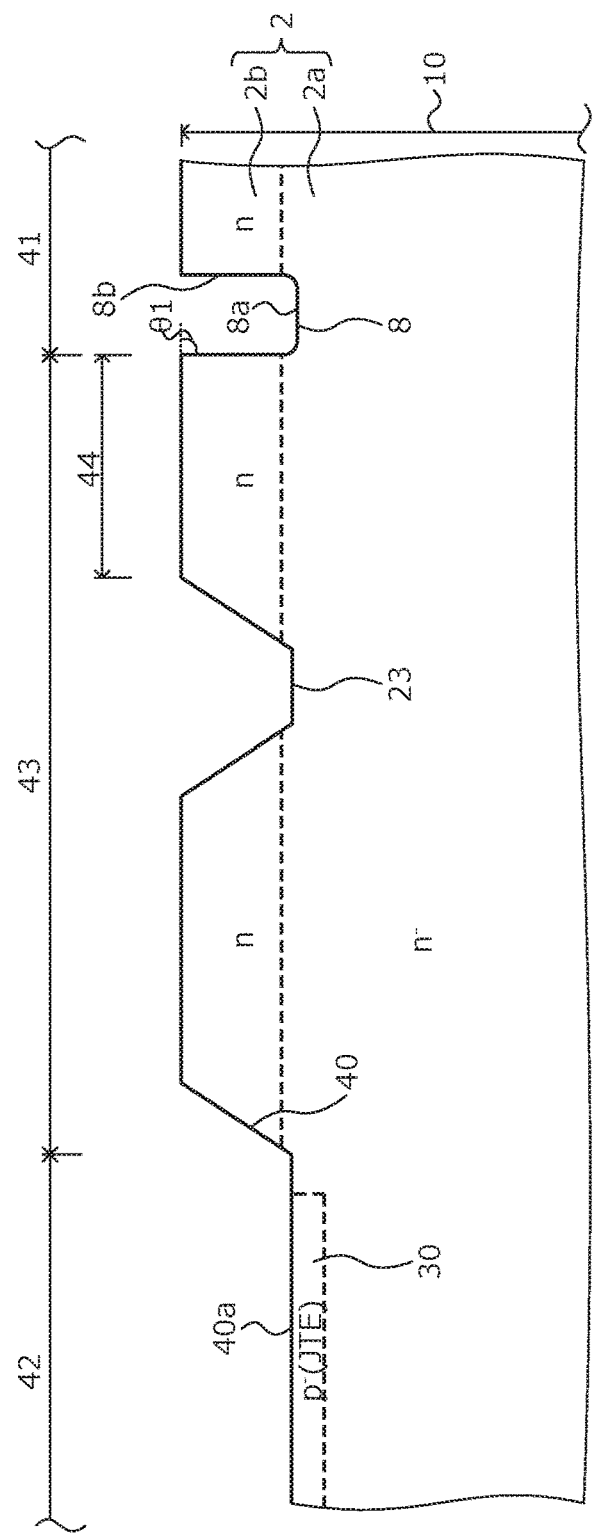

Next, on the front surface of the silicon carbide base 10, an oxide film (not depicted) is deposited to have a thickness of about, for example, 1.5 μm to 2.5 μm. The oxide film is patterned by photolithography and etching, exposing a portion that corresponds to a formation region of the contact trench 8. Next, after a resist mask (not depicted) used in patterning the oxide film is removed, the remaining portion of the oxide film is used as a mask and etching is performed, forming the contact trench 8 at a depth of, for example, about 0.5 μm to 2.5 μm. As a result, between the contact trench 8 and the tapered trench 23, the first mesa portion 44 is formed. The angle θ1 of the side walls 8b of the contact trench 8 with respect to the substrate front surface may be, for example, about 71 degrees to 90 degrees (71 degrees ≤θ1≤90°). The state up to here is depicted in FIG. 7.

Figure 8:
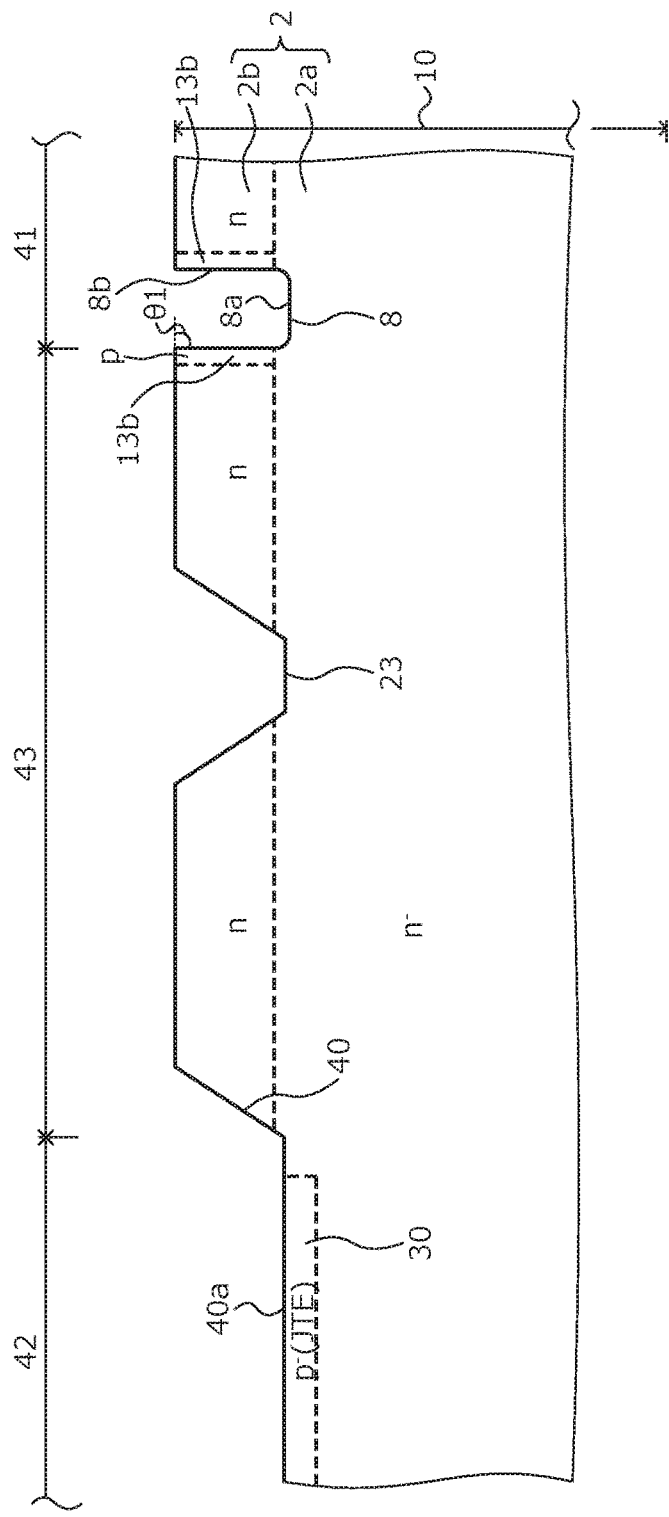

Next, the same oxide film used in forming the contact trench 8 is used as a mask and p-type impurity is ion implanted, forming the second p-type base region (first diffusion region) 13 (13b) at a portion along the side walls 8b of the contact trench 8. The second p-type base region 13 (13b) may be formed by plural ion implantations (multistage ion implantation) of differing ion implantation conditions. In the ion implantation for forming the second p-type base region 13 (13b), the dopant, temperature, dose amount, and acceleration energy may be the same ranges of the ion implantation for forming the p⁻-type low-concentration regions of the JTE structure 30. The implantation angle may be a range of about, for example, 11 degrees to 50 degrees with respect to the substrate front surface. The remaining portion of the oxide film used in forming the contact trench 8 and the second p-type base region 13 (13b) is removed. The state up to here is depicted in FIG. 8.

Next, on the front surface of the silicon carbide base 10, an oxide film (not depicted) is deposited to have thickness of about, for example, 1.5 μm to 2.5 μm. Next, the oxide film is patterned by photolithography and etching, exposing a portion that corresponds to formation regions of the bottom 8a of the contact trench 8 and the boundary region 43. Next, after a resist mask (not depicted) used in patterning the oxide film is removed, the remaining portion of the oxide film is used as a mask and a p-type impurity is ion implanted. As a result, in the substrate front surface at the bottom 8a of the contact trench 8 and the boundary region 43, the second p-type base region (second diffusion regions) 13 (13a, 13c) are formed. The second p-type base region 13 (13a, 13c) may be formed by multistage ion implantation.

Figure 9:
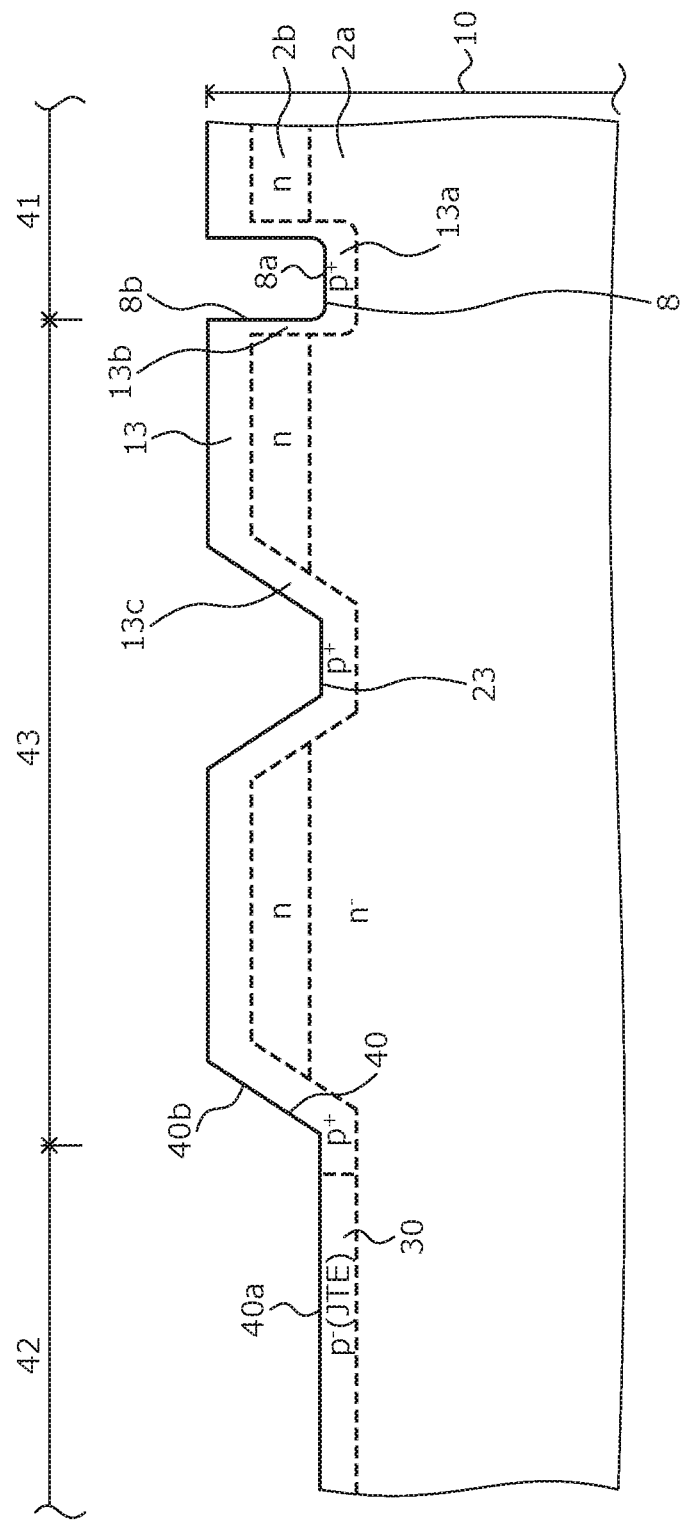
Figure 10:
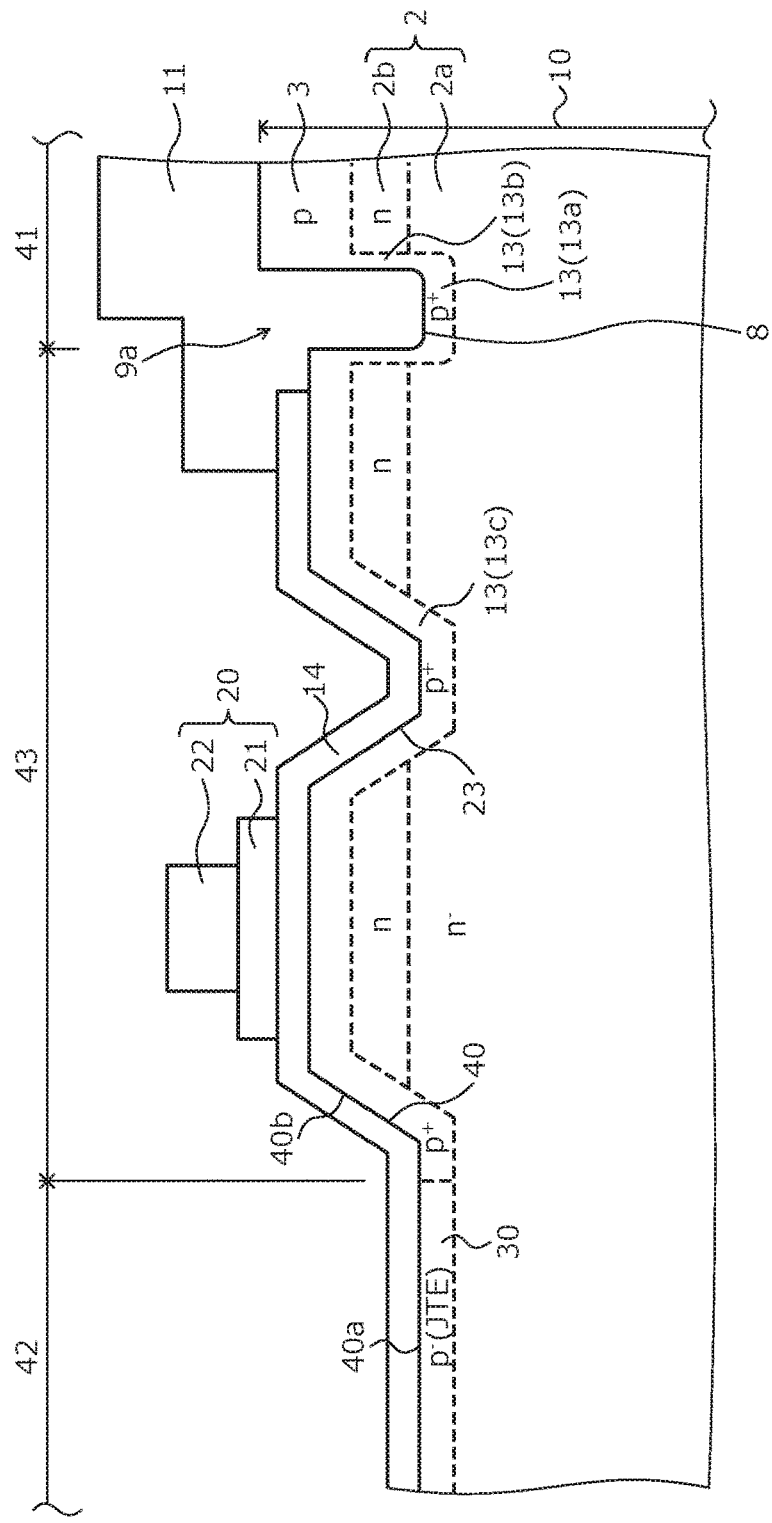

In the ion implantation for forming the second p-type base region 13 (13a, 13c), the dopant, temperature, acceleration energy, and implantation angle may be the same ranges as those of the ion implantation for forming the p⁻-type low-concentration regions of the JTE structure 30. A dose may be a range from about $1.0 \times 10^{13}/cm^2$ to $1.0 \times 10^{15}/cm^2$. By the processes up to here, in an outer periphery of the active region 41, the second p-type base region 13 is formed that extends from the side walls 8b of the contact trench 8 to the boundary region 43 and that is in contact with the first p-type base region 3 and the JTE structure 30. The remaining portion of the oxide film used informing the second p-type base region 13 (13a, 13c) is removed. The state up to here is depicted in FIG. 9.

Next, by a general method, in the active region 41, the first p-type base region 3, the n⁺-type source regions 4 (refer to FIG. 1), and the p⁺-type contact region (not depicted) are formed. Formation of these in the active region 41 may be before formation of the edge termination region 42 and the boundary region 43. The first p-type base region 3 may be formed by multistage ion implantation according to thickness and impurity concentration or by epitaxial growth. Next, for example, the front surface of the silicon carbide base 10 is subjected to thermal oxidation and the gate insulating film 6 (refer to FIG. 1) is formed. Next, on the front surface of the silicon carbide base 10, an insulating film becoming the interlayer insulating film 9 and the field oxide film 14 is deposited (formed) to have a thickness of about, for example, 0.1 μm to 5.0 μm. Next, on the insulating film, a poly-silicon layer becoming the gate electrode 7 and the gate runner 20 is deposited (formed) to have thickness of about 0.1 μm to 1.0 μm. The poly-silicon layer is patterned by photolithography and etching, and the poly-silicon layer is left to become the gate electrode 7 in the gate trench 5 and the poly-silicon layer 21 is left to become the gate runner 20 in the second mesa portion 45.

Next, after a resist mask (not depicted) used in patterning the poly-silicon layer is removed, the insulating film (the interlayer insulating film 9 and the field oxide film 14) and the gate insulating film 6 are patterned by photolithography and etching, and the contact hole 9a is formed. At this time, in the contact hole 9a, the n⁺-type source regions 4 and the p⁺-type contact region (not depicted) are exposed and the second p-type base region 13 (13a, 13b) of the bottom 8a and the side walls 8b of the contact trench 8 are also exposed. Next, after a resist mask (not depicted) used in patterning the insulating film and the gate insulating film 6 is removed, for example, an aluminum layer, becoming the source electrode 11 and the gate runner 20 is deposited (formed) to have a thickness of about 1.0 μm to 10.0 μm.

The aluminum layer is patterned by photolithography and etching, and the aluminum layer to become the source electrode 11 in the active region 41 remains together with the aluminum layer to become the metal layer 22 of the gate runner 20 in the second mesa portion 45. Next, after a resist mask (not depicted) used in patterning the source electrode 11 and the gate insulating film 6 is removed, on a rear surface (rear surface of the n⁺-type silicon carbide substrate 1) of the silicon carbide base 10, the drain electrode 12 is formed. Thereafter, semiconductor wafer is diced (cut) into individual chips whereby the trench-gate type SiC-MOSFET depicted in FIGS. 1 and 2 is completed.

Figure 11:
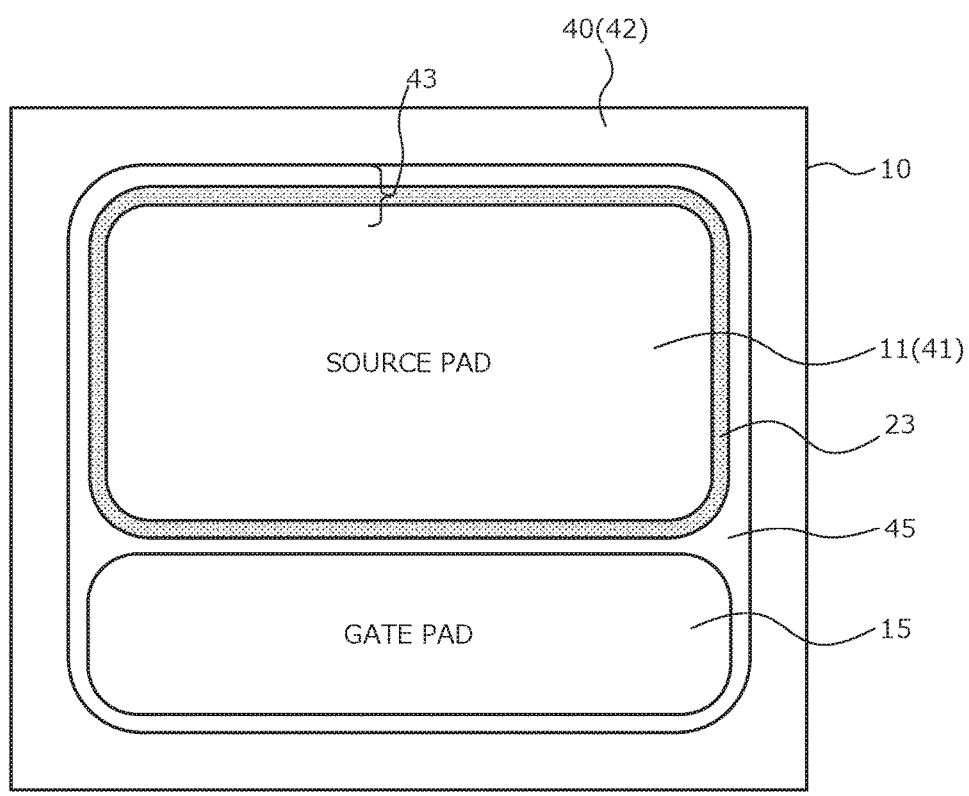
FIGS. 11, 12, and 13 are plan views of examples of planar layouts of the semiconductor device according to the embodiment.
Figure 12:
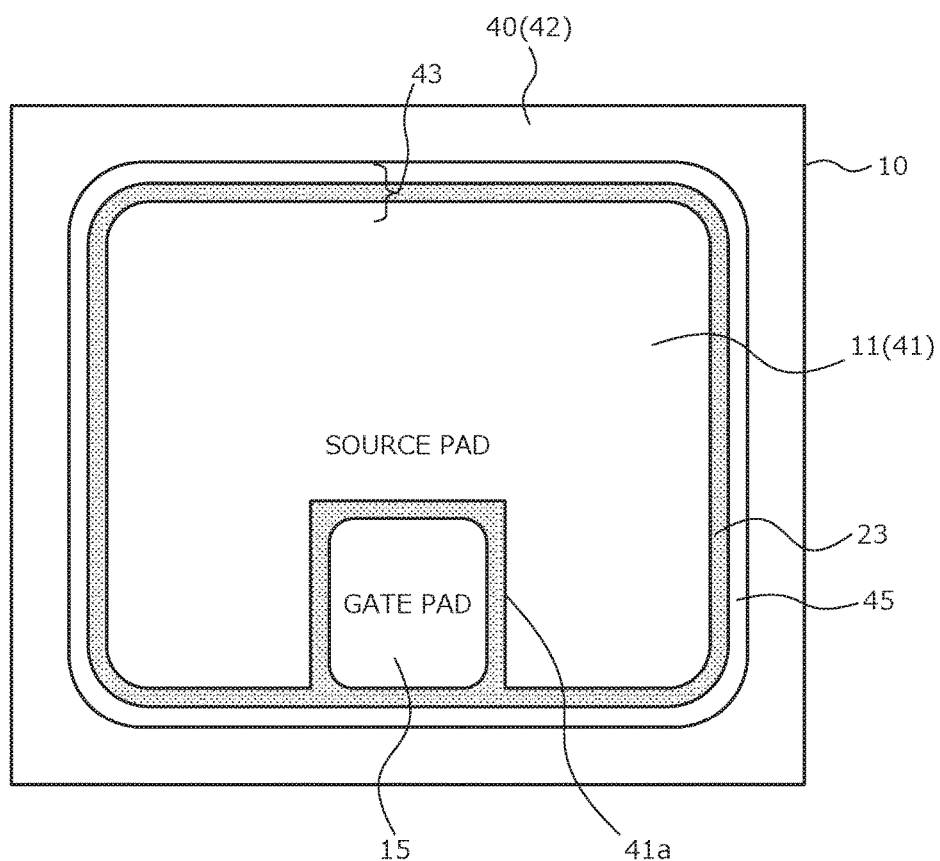
Figure 13:
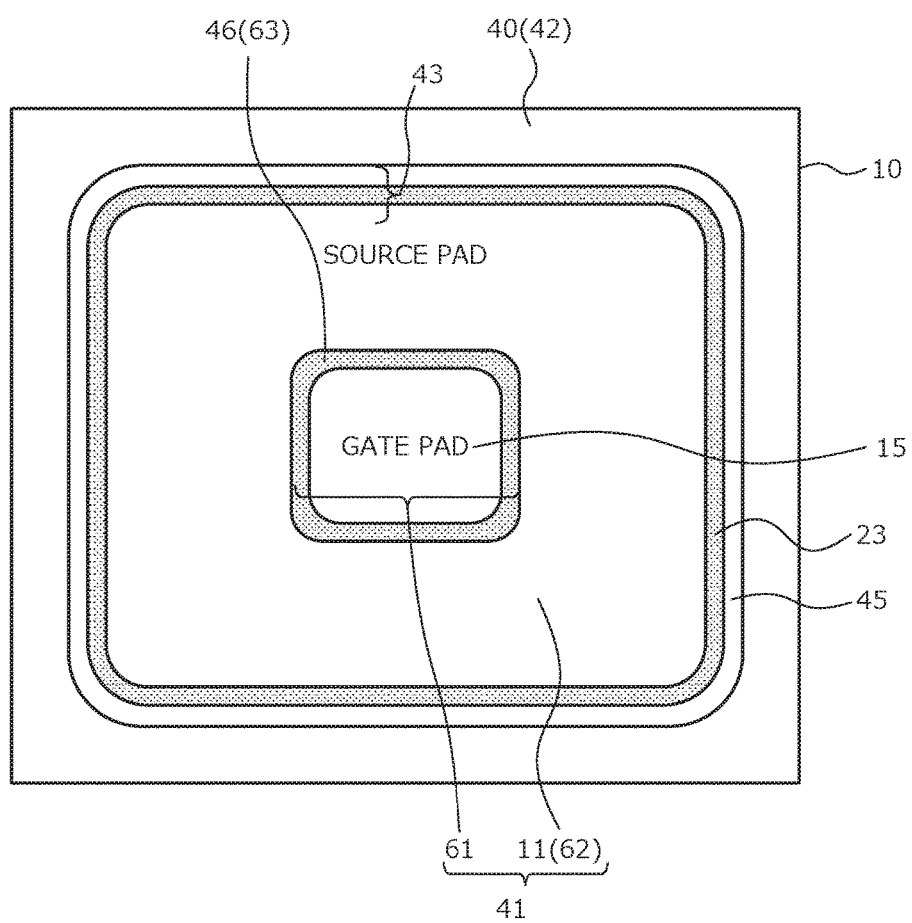

A planar layout of the trench-gate type SiC-MOSFET produced by the method of manufacturing a semiconductor device according to the embodiment above will be described. FIGS. 11, 12, and 13 are plan views of examples of planar layouts of the semiconductor device according to the embodiment. As depicted in FIG. 11, the active region 41 is arranged in a substantially rectangular-shaped planar layout. The source electrode 11 that becomes a source pad is arranged in a substantially rectangular-shaped planar layout substantially covering the entire surface of the active region 41. The tapered trench 23 is arranged in a concentric planar layout surrounding a periphery of the source electrode 11. The second mesa portion 45 is arranged in a concentric planar layout surrounding a periphery of a gate pad 15 and a periphery of the tapered trench 23. The step 40 is arranged in a substantially rectangular-shaped planar layout surround a periphery of the second mesa portion 45.

A planar layout of the semiconductor device according to the embodiment depicted in FIG. 12 differs from the planar layout of the semiconductor device according to the embodiment depicted in FIG. 11 in that a portion of the active region 41 is arranged in substantially concave-shaped planar layout. In this case, a portion of the tapered trench 23 is arranged in a convex-shape planar layout protruding inside a concave portion 41a of the active region 41. In this convex portion, the gate pad 15 is arranged, and the tapered trench 23 is arranged so as to surround a periphery of the gate pad 15.

A planar layout of the semiconductor device according to the embodiment depicted in FIG. 13 differs from the planar layout of the semiconductor device according to the embodiment depicted in FIG. 11 in that in the active region 41, for example, an non-effective region 61 is provided in a substantially rectangular-shaped planar layout and in the non-effective region 61, the gate pad 15 is arranged. In this case, in a boundary region 63 between the non-effective region 61 and an effective region 62 in the active region 41, a second tapered trench 46 (23) is arranged in a substantially rectangular-shape frame planar layout surrounding a periphery of the non-effective region 61. The non-effective region 61 is a region in which no unit cell is arranged. The effective region 62 is a region in which a unit cell is arranged.

Although not depicted in FIG. 13, the second tapered trench 46 (23) is formed between the adjacent first mesa portion and second mesa portion. A configuration of the second tapered trench 46 (23) is the same as that of the tapered trench 23 of the boundary region 43 between the active region 41 and the edge termination region 42. In an inner periphery of the effective region 62 of the active region 41, a concentration of electric field at the portion 13d of the second p-type base region 13 along the bottom corner portion 8c of the contact trench 8 and having a large curvature is mitigated by the second tapered trench 46 (23).

Further, although not depicted in FIGS. 11 to 13, the gate pad 15 is electrically connected to all of the non-depicted gate electrodes 7 arranged in the active region 41 (refer to FIG. 1) and to the gate runner 20 arranged in the second mesa portion 45 (refer to FIG. 2).

As described, according to embodiment, a concentration of electric field at the contact trench in the outer periphery of the active region is mitigated by the tapered trench arranged in the boundary region. Therefore, by arranging a gate runner between the edge termination region and tapered trench resistant to electric field concentration, decreases in breakdown voltage may be prevented.

Various modifications in the present invention are possible. In the embodiment above, for example, dimensions, impurity concentrations, etc. of regions, layers, etc. may be variously set according to required specifications. Further, the described manufacturing process flow is one example and the sequence in which regions, layers, etc. are formed may be interchanged. For example, the formation sequence of the contact trench, the tapered trench, and the step may be changed. Further, the formation sequence of the JTE structure, the portion of the second p-type base region along the side wall of contact trench and portions other than this portion may be interchanged. In the embodiments, although a MOSFET has been described as an example, the present invention is applicable to MOS semiconductor devices such as insulated gate bipolar transistors (IGBTs). Further, by providing the boundary region between the active region and the edge termination region, the present invention is applicable to semiconductor devices of a configuration in which electric field concentrates near a trench (groove) bottom corner portion in the active region. In the embodiments, although a first conductivity type is assumed as an n-type and a second conductivity type is assumed as a p-type, the present invention is similarly implemented when the first conductivity type is a p-type and the second conductivity type is an n-type.

Nonetheless, with a conventional trench-gate type SiC-MOSFET, in the boundary region 143 in which the gate runner 120 is arranged, the second p-type base region 113 extends in a substantially flat manner at a depth shallower from the base front surface (the front surface of the silicon carbide base 110) than a portion along the inner wall of the contact trench 108 is. Therefore, in an outer periphery of the active region 141, electric field concentrates at a portion 113a of the second p-type base region 113 along a bottom corner portion 108c of the contact trench 108 and having a large curvature and decreases in the breakdown voltage occur. In this manner, prevention of breakdown voltage decreases consequent to electric field concentration at the contact trench 108 occurring near an outer periphery of the active region 141 and arrangement of the gate runner 120 between the active region 141 and the edge termination region 142 are difficult to achieve concurrently.

According to the present invention, by the second groove arranged in the boundary region, electric field concentration at the first groove in an outer periphery of the active region may be mitigated. Therefore, by arranging the gate runner between the termination region and the second groove resistant to electric field concentration, breakdown voltage decreases may be prevented.

The semiconductor device and the method of manufacturing a semiconductor device according to the present invention achieve an effect in that breakdown voltage decreases may be prevented in a semiconductor device in which a groove embedded with an electrode is provided in the active region.

As described, the semiconductor device and the method of manufacturing a semiconductor device of the present invention are useful for power semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device comprising:
   a semiconductor substrate of a first conductivity type;
   a first electrode embedded in a first groove formed in a first main surface of the semiconductor substrate in an active region of the semiconductor substrate;

a second electrode in the active region, configured such that a current flows between the first electrode and the second electrode when the semiconductor device is in an ON state;

a termination region surrounding the active region; and a boundary region provided between the active region and the termination region, the boundary region including a second groove provided in the first main surface of the semiconductor substrate and having a side wall with a slope that is smaller than that of the first groove with respect to the first main surface of the semiconductor substrate, and the boundary region further including a first semiconductor region of a second conductivity type provided along an inner wall of the second groove.

2. The semiconductor device according to claim 1, wherein a distance between the first groove and the second groove is 8 μm or less.

3. The semiconductor device according to claim 1, further comprising:

a second semiconductor region of the second conductivity type in the active region, the second semiconductor region being in contact with the first electrode at an inner wall of the first groove, wherein an impurity concentration of the second semiconductor region is equal to an impurity concentration of the first semiconductor region at a portion of the second semiconductor region along the inner wall of the first groove.

4. The semiconductor device according to claim 3, wherein the second semiconductor region extends along the first main surface of the semiconductor substrate to the boundary region and is connected to the first semiconductor region.

5. The semiconductor device according to claim 3, further comprising, in the active region:

a third semiconductor region of the first conductivity type selectively provided in the second semiconductor region;

a gate insulating film provided in contact with a region of the second semiconductor region between the semiconductor substrate and the third semiconductor region; and a gate electrode provided on an opposite side of the second semiconductor region via the gate insulating film, wherein a gate runner electrically connected to the gate electrode is provided between the second groove and the termination region.

6. The semiconductor device according to claim 1, wherein the semiconductor substrate is a silicon carbide substrate.

7. A method of manufacturing a semiconductor device, the method comprising:

forming a first groove in a first main surface of a semiconductor substrate of a first conductivity type, the first groove being formed in an active region;

forming a second groove in the first main surface of the semiconductor substrate in a boundary region between the active region and a termination region surrounding the active region, the second groove having a side wall of a slope smaller than that of the first groove with respect to the first main surface;

forming a first diffusion region of a second conductivity type along a side wall of the first groove;

forming a second diffusion region of the second conductivity type along a bottom of the first groove and an inner wall of the second groove;

forming a first electrode so as to be embedded in the first groove; and forming a second electrode, such that current flows between the first electrode and the second electrode when the semiconductor device is in an ON state.

* * * * *